United States Patent
Ikeda

(10) Patent No.: US 11,081,431 B2
(45) Date of Patent: Aug. 3, 2021

(54) CIRCUIT DEVICE

(71) Applicants: AutoNetworks Technologies, Ltd., Mie (JP); Sumitomo Wiring Systems, Ltd., Mie (JP); Sumitomo Electric Industries, Ltd., Osaka (JP)

(72) Inventor: Jun Ikeda, Mie (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 74 days.

(21) Appl. No.: 16/612,890

(22) PCT Filed: Apr. 26, 2018

(86) PCT No.: PCT/JP2018/016919
§ 371 (c)(1),
(2) Date: Nov. 12, 2019

(87) PCT Pub. No.: WO2018/211935
PCT Pub. Date: Nov. 22, 2018

(65) Prior Publication Data
US 2020/0168532 A1    May 28, 2020

(30) Foreign Application Priority Data
May 17, 2017   (JP) .............................. JP2017-098196

(51) Int. Cl.
*H01L 23/495*   (2006.01)
*H01L 23/32*    (2006.01)
(Continued)

(52) U.S. Cl.
CPC ........ *H01L 23/49562* (2013.01); *H01L 23/32* (2013.01); *H01L 23/3672* (2013.01);
(Continued)

(58) Field of Classification Search
CPC ............... H01L 23/49562; H01L 23/32; H01L 23/3672; H01L 23/49548; H01L 23/49575; H01L 23/495; H01L 23/367; H01R 4/34
(Continued)

(56) References Cited

U.S. PATENT DOCUMENTS

| | | | |
|---|---|---|---|
| 9,147,666 B2 * | 9/2015 | Yoshihara | H01L 23/645 |
| 10,187,973 B2 * | 1/2019 | Nakamura | H05K 1/0306 |
| 2006/0092599 A1 | 5/2006 | Yamamura et al. | |
| 2017/0027074 A1 * | 1/2017 | Ichikawa | H01L 23/5384 |

(Continued)

FOREIGN PATENT DOCUMENTS

| | | |
|---|---|---|
| JP | 2003-164040 A | 6/2003 |
| JP | 2015-139289 A | 7/2015 |

OTHER PUBLICATIONS

International Search Report, Application No. PCT/JP2018/016919, dated Jul. 24, 2018. ISA/Japan Patent Office.

*Primary Examiner* — Alexander O Williams
(74) *Attorney, Agent, or Firm* — Honigman LLP

(57) ABSTRACT

A circuit device includes a first conductive plate and a second conductive plate each having a belt-shaped portion arranged side-by-side with each other, a third conductive plate having a belt-shaped portion is arranged side-by-side with and spaced apart from the other side portion of the first conductive plate, a first circuit component having a first terminal connected to the first conductive plate and a second terminal connected to the second conductive plate, a second circuit component having a first terminal connected to the first conductive plate and a second terminal connected to the third conductive plate, a first external connection portion provided at the belt-shaped portion of the first conductive plate, and a second external connection portion provided at the belt-shaped portion of the second conductive plate or a (Continued)

third external connection portion provided at the belt-shaped portion of the third conductive plate.

12 Claims, 10 Drawing Sheets

(51) Int. Cl.
    *H01L 23/367* (2006.01)
    *H01R 4/34* (2006.01)

(52) U.S. Cl.
    CPC .. *H01L 23/49548* (2013.01); *H01L 23/49575* (2013.01); *H01R 4/34* (2013.01)

(58) Field of Classification Search
    USPC .......................................................... 257/666
    See application file for complete search history.

(56) References Cited

U.S. PATENT DOCUMENTS

| | | | |
|---|---|---|---|
| 2017/0094790 A1 | 3/2017 | Tazarine et al. | |
| 2017/0287828 A1* | 10/2017 | Sawada | H01L 25/072 |
| 2018/0278172 A1* | 9/2018 | Tokuyama | H01L 23/49541 |
| 2019/0181770 A1* | 6/2019 | Martin | H02M 1/08 |
| 2019/0295932 A1* | 9/2019 | Nakata | H01L 23/28 |
| 2019/0333909 A1* | 10/2019 | Sugita | H01L 23/473 |
| 2020/0008314 A1* | 1/2020 | Kuroiwa | H05K 5/006 |
| 2020/0013752 A1* | 1/2020 | Nakamura | H02M 7/5387 |
| 2020/0051765 A1* | 2/2020 | Hiramitsu | H02G 3/14 |
| 2020/0053900 A1* | 2/2020 | Feurtado | H05K 7/1432 |
| 2020/0185302 A1* | 6/2020 | Lu | H01L 23/04 |
| 2020/0194159 A1* | 6/2020 | Tsuchida | H01F 27/02 |
| 2020/0211926 A1* | 7/2020 | Tahara | H02G 3/081 |
| 2020/0243489 A1* | 7/2020 | Domes | H01L 25/18 |
| 2020/0258834 A1* | 8/2020 | Nakano | H01L 23/50 |
| 2020/0381327 A1* | 12/2020 | Sasaki | H01L 23/49531 |
| 2020/0388550 A1* | 12/2020 | Wakaiki | H01L 21/4882 |
| 2021/0044213 A1* | 2/2021 | Kojima | H01G 2/10 |

* cited by examiner ions is the U.S. national stage of PCT/JP2018/# CIRCUIT DEVICE

CROSS-REFERENCE TO RELATED APPLICATIONS

This applicat016919 filed on Apr. 26, 2018, which claims priority of Japanese Patent Application No. JP 2017-098196 filed on May 17, 2017, the contents of which are incorporated herein.

TECHNICAL FIELD

The present disclosure relates to a circuit device.

BACKGROUND

Circuit devices for controlling a large current, such as a current-voltage converter and a large-current relay, are installed in a vehicle. Such a circuit device has a plurality of semiconductor switches for turning ON/OFF an electric current, such as MOSFETs (metal-oxide-semiconductor field effect transistors), for example. Drain terminals and source terminals of the plurality of semiconductor switches are connected to a pair of conductive plates, and the conductive plates are disposed on a radiator via an insulating layer (JP 2003-164040A, for example). The conductive plates are so-called bus bars.

If a pair of belt-shaped conductive plates are arranged side-by-side such that their side portions face each other, and a plurality of semiconductor switches are arranged along these side portions, the electric current flowing to the semiconductor switches varies because the conductive plates have small cross-sectional areas. Specifically, in a circuit device configured to receive and output electric current from one end of a conductive plate, a larger electric current flows to circuit components disposed on the one end, and a smaller electric current flows to circuit components disposed on the other end.

In view of this, it is conceivable that a circuit device is configured such that, as a result of forming each conductive plate in a hook shape or a spiral shape and disposing the conductive plates fitted to each other such that the overall shape is a rectangular flat plate shape, the current path lengths of the respective circuit components are equal to each other, and a uniform electric current flows to both ends of each circuit component (see FIG. 10).

There has been a problem in that the above-described circuit device according to the background art has a circuit arrangement in which a pair of conductive plates have long path lengths and the mounting area is increased because the conductive plates are arranged in consideration of the variation in electric current. Note that the circuit device having such issues is not limited to a large current relay, and any circuit device configured by connecting two terminals of each of a plurality of circuit components to conductive plates has the same issues.

An object of the present disclosure is to provide a circuit device in which the area for mounting a plurality of circuit components and conductive plates can be made smaller than in a configuration in which a pair of conductive plates that are connected to two terminals of each of the plurality of circuit components are arranged.

SUMMARY

A circuit device according to this aspect includes a first conductive plate having a belt-shaped portion, a second conductive plate having a belt-shaped portion that is arranged side-by-side with one side portion of the first conductive plate and is spaced apart from the one side portion, a third conductive plate having a belt-shaped portion that is arranged side-by-side with another side portion of the first conductive plate and is spaced apart from the other side portion, a first circuit component having a first terminal connected to the first conductive plate and a second terminal connected to the second conductive plate, a second circuit component having a first terminal connected to the first conductive plate and a second terminal connected to the third conductive plate, a first external connection portion provided at the belt-shaped portion of the first conductive plate, and a second external connection portion provided at the belt-shaped portion of the second conductive plate, or a third external connection portion provided at the belt-shaped portion of the third conductive plate.

Advantageous Effects of Disclosure

According to the present disclosure, it is possible to provide a circuit device in which the area for mounting a plurality of circuit components and conductive plates can be made smaller than in a configuration in which a pair of conductive plates that are connected to two terminals of each of the plurality of circuit components are arranged.

DETAILED DESCRIPTION OF PREFERRED EMBODIMENTS

Figure 1:
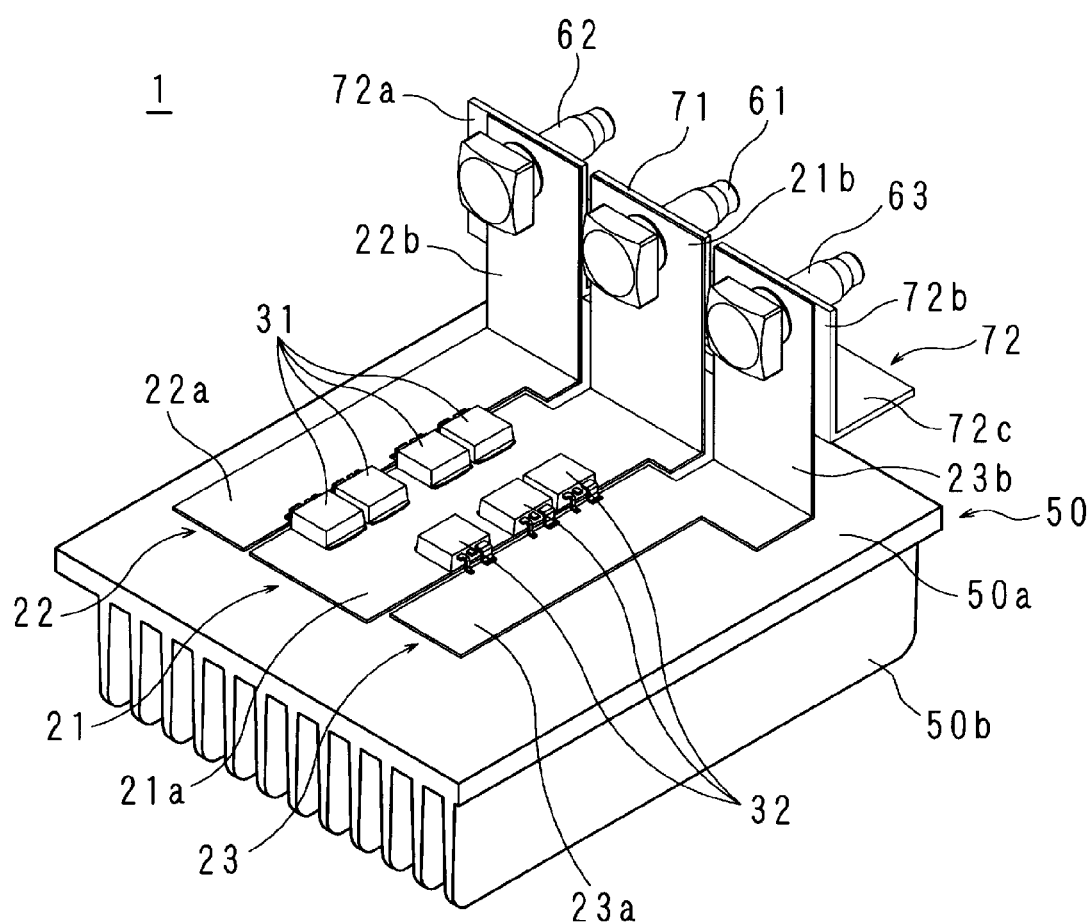
FIG. 1 is a rear perspective view showing one configuration example of a circuit device according to this embodiment from which a circuit board is detached.

First, embodiments of the present disclosure will be described. At least some embodiments described below may also be combined.

A circuit device according to this aspect includes a first conductive plate having a belt-shaped portion, a second conductive plate having a belt-shaped portion that is arranged side-by-side with one side portion of the first conductive plate and is spaced apart from the one side portion, a third conductive plate having a belt-shaped portion that is arranged side-by-side with another side portion of the first conductive plate and is spaced apart from the other side portion, a first circuit component that has a first terminal connected to the first conductive plate and a second terminal connected to the second conductive plate, a second circuit component that has a first terminal connected to the first conductive plate and a second terminal connected to the third conductive plate, a first external connection portion provided at the belt-shaped portion of the first conductive plate, and a second external connection portion provided at the belt-shaped portion of the second conductive plate, or a third external connection portion provided at the belt-shaped portion of the third conductive plate.

According to this aspect, the first terminals of the first and second circuit components are connected to the first conductive plate, the second terminals of the first and second circuit components are respectively connected to the second conductive plate and the third conductive plate, and thus, it is possible to reduce the path lengths of the first to third conductive plates. Also, although the first to third conductive plates are provided with external connection portions, the above-described configuration makes it possible to make the lengths of paths extending from the external connection portions to the first and second circuit components substantially equal to each other, and to suppress variation in electric current flowing through the circuit components. In other words, the circuit device according to this aspect is capable of further suppressing variation in electric current, compared to a configuration in which the first and second circuit components are arranged side-by-side only with one side portion or the other side portion of the first conductive plate.

Thus, it is possible to reduce the area for mounting the first to third conductive plates and the first and second circuit components, and to reduce the size of a circuit device.

A configuration is preferable in which the first circuit component and the second circuit component each include a third terminal for controlling an electric current, and the circuit device includes a circuit board that is disposed on one side of the first conductive plate, the second conductive plate, and the third conductive plate, and to which the third terminals of the circuit components are connected, and a radiator that is disposed on the other side of the first conductive plate, the second conductive plate, and the third conductive plate.

According to this aspect, because the third terminals of the first and second circuit components are connected to the circuit board, the operation of the circuit components can be controlled by applying, from the circuit board, an electric current or a voltage to the third terminals of the first and second circuit components. Although heat dissipation is suppressed because the circuit board is disposed on one side of the first to third conductive plates, it is possible to effectively dissipate heat generated by an electric current flowing through the first to third conductive plates because the radiator is disposed on the other side of the first to third conductive plates.

A configuration is preferable in which the first circuit component and the second circuit component are semiconductor switches.

According to this aspect, it is possible to reduce the size of a circuit device provided with semiconductor switches as the first and second circuit components.

A configuration is preferable in which the first circuit component and the second circuit component are field effect transistors, the first terminals are drain terminals, the second terminals are source terminals, and the third terminals are gate terminals.

According to this aspect, it is possible to reduce the size of a circuit device provided with field effect transistors as the first and second circuit components.

A configuration is preferable in which the first terminal is larger than the second terminal, the width of the belt-shaped portion of the first conductive plate is larger than the width of the belt-shaped portions of the second conductive plate and the third conductive plate, and the first circuit component and the second circuit component are disposed on the first conductive plate.

According to this aspect, a larger first terminal is connected to a wider first conductive plate, and the first and second circuit components are disposed on the first conductive plate. Thus, it is possible to reduce the size of the circuit device.

A configuration is preferable in which the circuit device includes a linking member for electrically linking the belt-shaped portion of the second conductive plate or the belt-shaped portion of the third conductive plate, and the cross-sectional area of the linking member is larger than that of the second conductive plate and the third conductive plate.

According to this aspect, the second and third conductive plates are linked by the linking member whose cross-sectional area is larger than that of the second and third conductive plates. As a result of forming the linking member with a larger cross-sectional area, it is possible to suppress generation of heat in the linking member. Although the cross-sectional areas of the second and third conductive plates are smaller than that of the linking member, it is also possible to suppress generation of heat in the second and third conductive plates because an electric current is shunted to the second and third conductive plates.

A configuration is preferable in which the circuit device includes a housing for housing the first conductive plate, the second conductive plate, the third conductive plate, the first circuit component, and the second circuit component, and the linking member is disposed outside the housing.

According to this aspect, because the linking member is disposed outside the housing, it is possible to dissipate heat generated in the first to third conductive plates and the first and second circuit components to the outside of the housing via the linking member. It is also possible to effectively dissipate heat generated in the linking member.

Specific examples of a circuit device according to an embodiment of the present disclosure will be described below with reference to the drawings. Note that the present disclosure is not limited to these examples, and is defined by the claims, and all changes that come within the meaning and range of equivalency of the claims are intended to be embraced therein.

Figure 2:
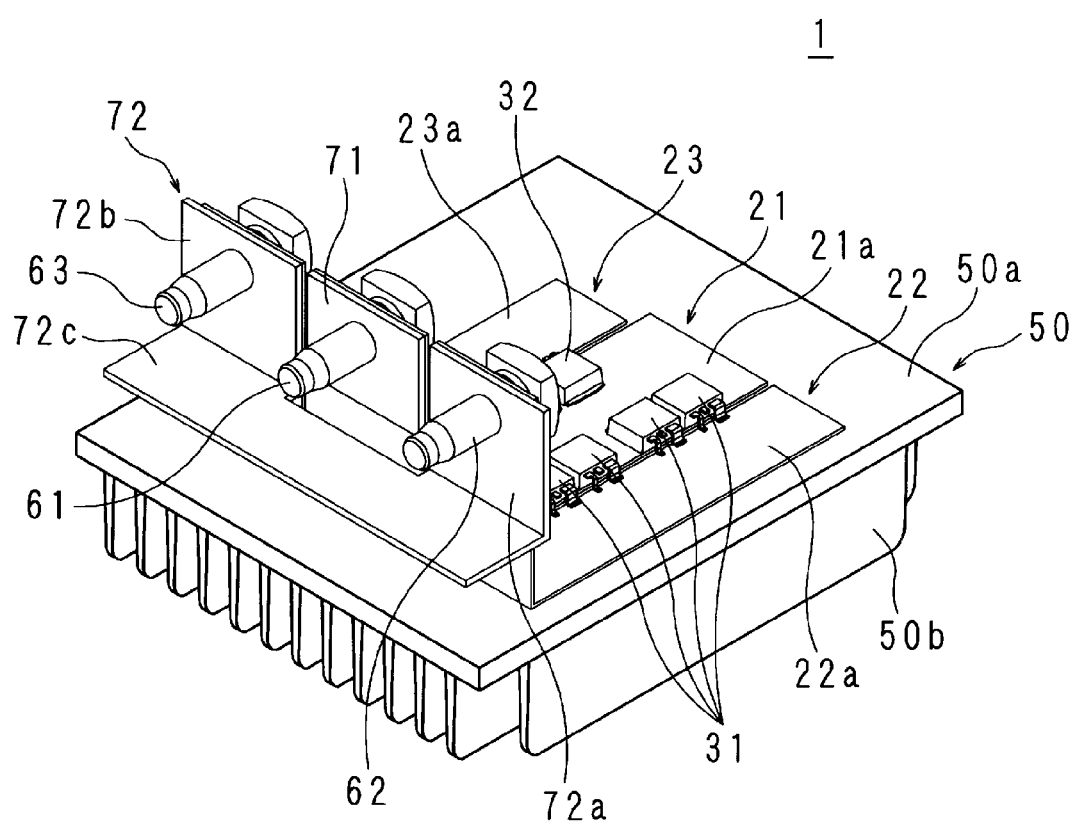
FIG. 2 is a front perspective view showing one configuration example of the circuit device according to this embodiment from which the circuit board is detached.
Figure 3:
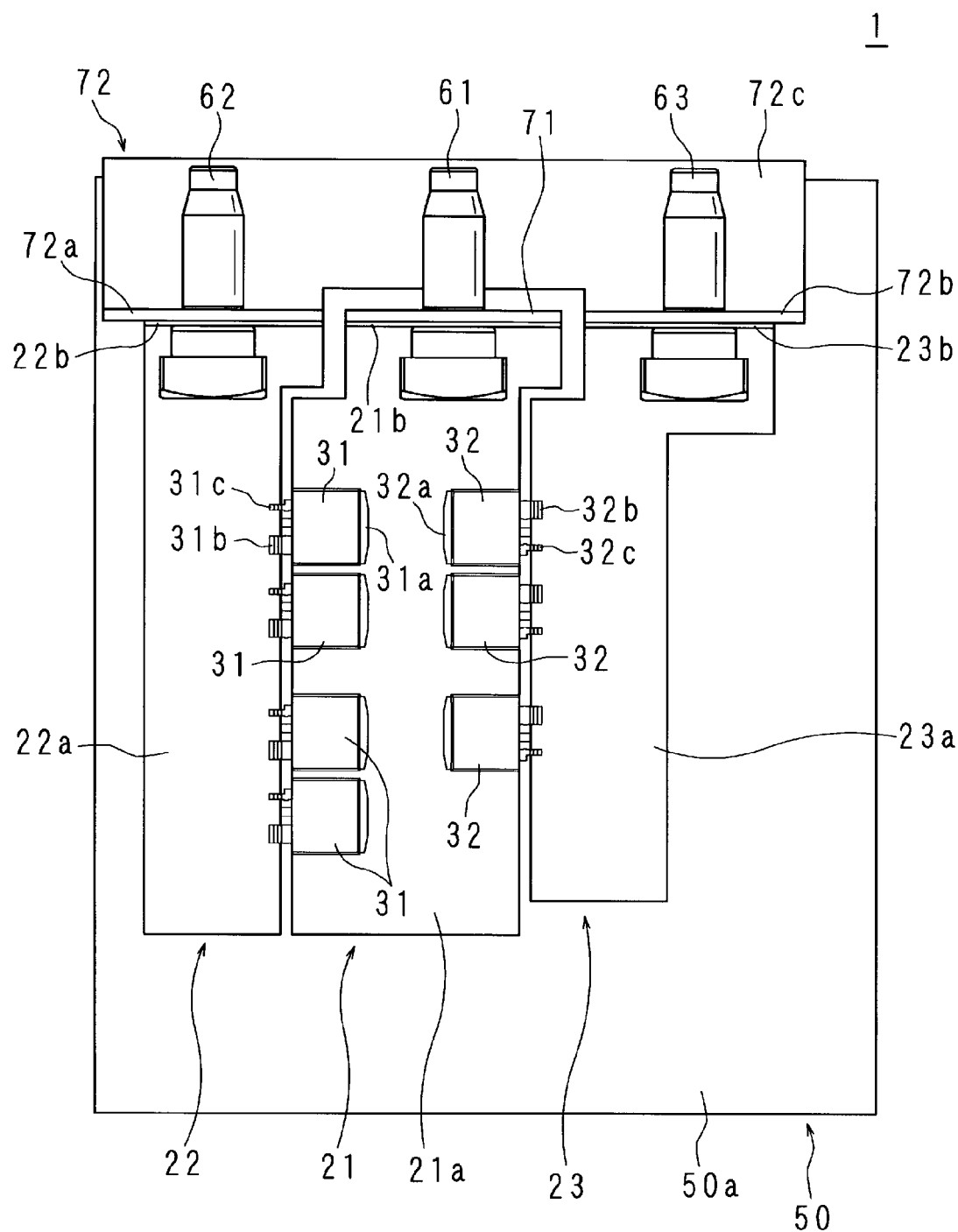
FIG. 3 is a plan view showing one configuration example of the circuit device according to this embodiment from which the circuit board is detached.

FIG. 1 is a rear perspective view showing one configuration example of a circuit device 1 according to this embodiment from which a circuit board 40 is detached, FIG. 2 is a front perspective view showing one configuration example of the circuit device 1 according to this embodiment from which the circuit board 40 is detached, and FIG. 3 is a plan view showing one configuration example of the circuit device 1 according to this embodiment from which the circuit board 40 is detached.

The circuit device 1 according to this embodiment is installed in a vehicle, for example, and controls a large electric current. The circuit device 1 includes a first conductive plate 21, a second conductive plate 22, and a third conductive plate 23, a plurality of first circuit components 31 and a plurality of second circuit components 32 that are connected to the conductive plates, the circuit board 40 (see FIG. 4), a radiator 50, a first external connection portion 61, a second external connection portion 62, and a third external connection portion 63, and a linking member 72 having a first terminal connection plate 71, and second and third terminal connection plates 72a and 72b.

The radiator 50 is made of a metal with good thermal conductivity, such as aluminum, for example, and has a rectangular flat plate portion 50a. One side of the flat plate portion 50a is flat, and the other side of the flat plate portion 50a is provided with heat dissipation fins 50b.

Hereinafter, the flat side of the radiator 50 is regarded as the upper side (the upper side in FIG. 1), and the side of the radiator 50 provided with the heat dissipation fins 50b is regarded as the lower side (the lower side in FIG. 1). Also, one side of the flat plate portion 50a, in particular, the side on which the first to third external connection portions 61, 62, and 63 (the front side in FIG. 2) is regarded as the front side.

The first to third conductive plates 21, 22, and 23 function as so-called bus bars, and are made of an alloy whose electrical conductivity is lower than that of pure copper, such as an aluminum alloy, for example. The first to third conductive plates 21, 22, and 23 have an L-shaped side cross-section, and respectively include first to third belt-shaped (band-shaped) plate portions 21a, 22a, and 23a, and first to third bent plate portions 21b, 22b, and 23b obtained by bending the first to third belt-shaped portions 21a, 22a, and 23a at their one end.

The first belt-shaped plate portion 21a of the first conductive plate 21 is disposed at a substantially central portion of the flat plate portion 50a that is a part of the radiator 50 via an insulating layer, and is thermally connected thereto. The first conductive plate 21 is oriented such that the first bent plate portion 21b is located on one side (the back side on the paper plane in FIG. 1) of the flat plate portion 50a, and both side portions of the first belt-shaped plate portion 21a are substantially parallel to both sides of the flat plate portion 50a that is a part of the radiator 50, for example. The insulating layer is an adhesive, for example, and the first conductive plate 21 and the radiator 50 are adhered to each other by the insulating layer. The first conductive plate 21 is wider than the second conductive plate 22 and the third conductive plate 23. The width of the first conductive plate 21 is approximately twice the width of the second conductive plate 22 and the third conductive plate 23, for example.

The second belt-shaped plate portion 22a of the second conductive plate 22 is arranged side-by-side with one side portion of the first conductive plate 21 and is spaced apart from this one side portion, and is adhered to the flat plate portion 50a of the radiator 50 by the insulating layer, which is an adhesive. That is, the second belt-shaped plate portion 22a is disposed such that a side portion of the second belt-shaped plate portion 22a and the one side portion of the first conductive plate 21 are substantially parallel to each other. Also, similarly to the first bent plate portion 21b, the second bent plate portion 22b is located on one side of the flat plate portion 50a, and is arranged side-by-side with the first bent plate portion 21b in the same plane.

The third belt-shaped plate portion 23a of the third conductive plate 23 is arranged side-by-side with the other side portion of the first conductive plate 21 and is spaced apart from this other side portion, and is adhered to the flat plate portion 50a of the radiator 50 by the insulating layer, which is an adhesive. That is, the third belt-shaped plate portion 23a is disposed such that a side portion of the third belt-shaped plate portion 23a and the other side portion of the first conductive plate 21 are substantially parallel to each other. Also, similarly to the first bent plate portion 21b, the third bent plate portion 23b is located on one side of the flat plate portion 50a, and is arranged side-by-side with the first bent plate portion 21b in the same plane.

A plurality of first circuit components 31 are arranged side-by-side along one side portion of the first conductive plate 21. The first circuit components 31 each include a first terminal 31a and a second terminal 31b for receiving and outputting an electric current, and a third terminal 31c for receiving an electric current or a voltage corresponding to a control signal for controlling an electric current. The first circuit component 31 has a packaging having a substantially rectangular shape in a plan view, and one side of the packaging is provided with the first terminal 31a, and the other side of the packaging is provided with the second terminal 31b and the third terminal 31c. The first terminal 31a of the first circuit component 31 is connected to an end portion of the first conductive plate 21 located on its one side portion, and the second terminal 31b is connected to an end portion of the second conductive plate 22 located on its side portion. The first terminal 31a is larger than the second terminal 31b in a plan view, and the first circuit components 31 are disposed on the first conductive plate 21.

The first circuit components 31 are semiconductor switches, for example. More specifically, the first circuit components 31 are field effect transistors such as MOSFETs. The first terminals 31a are drain terminals, the second terminals 31b are source terminals, and the third terminals 31c are gate terminals.

A plurality of second circuit components 32 are arranged side-by-side along the other side portion of the first conductive plate 21. The second circuit components 32 each include a first terminal 32a and a second terminal 32b for receiving and outputting an electric current, and a third terminal 32c for receiving an electric current or a voltage corresponding to a control signal for controlling an electric current. The second circuit component 32 has a packaging having a substantially rectangular shape in a plan view, and one side of the packaging is provided with the first terminal 32a, and the other side of the packaging is provided with the second terminal 32b and the third terminal 32c. The first terminal 32a of the second circuit component 32 is connected to an end portion of the first conductive plate 21 located on its other side portion, and the second terminal 32b is connected to an end portion of the third conductive plate 23 located on its side portion. The first terminal 32a is larger than the second terminal 32b in a plan view, and the second circuit components 32 are disposed on the first conductive plate 21.

Similarly to the first circuit components 31, the second circuit components 32 are semiconductor switches such as field effect transistors. The first terminals 32a are drain terminals, the second terminals 32b are source terminals, and the third terminals 32c are gate terminals.

Leading end portions of the first to third bent plate portions 21b, 22b, and 23b are respectively provided with a first external connection portion 61, a second external connection portion 62, and a third external connection portion 63. The first to third external connection portions 61, 62, and 63 have bolt portions for connecting conductive wires (not shown) to the first to third bent portions, for example.

A first terminal connection plate 71 to which a terminal of a conductive wire is connected is disposed on the front side (the front side in FIG. 2) of the leading end portion of the first bent plate portion 21b, and the first terminal connection plate 71 is fixed to the leading end portion of the first bent plate portion 21b by inserting, from the rear side, the first external connection portion 61 into holes (not shown) formed in the leading end portion and the first terminal connection plate 71.

The linking member 72 for electrically linking one end of the second conductive plate 22 and one end of the third conductive plate 23, that is, the leading end portions of the second bent plate portion 22b and the third bent plate portion 23b is provided on the front side (the front side in FIG. 2) of the second bent plate portion 22b and the third bent plate portion 23b. The linking member 72 includes the second terminal connection plate 72a disposed on the front side of the leading end portion of the second bent plate portion 22b, the third terminal connection plate 72b disposed on the front side of the leading end portion of the third bent plate portion 23b, and a linking plate portion 72c for linking the second terminal connection plate 72a and the third terminal connection plate 72b. The second terminal connection plate 72a and the third terminal connection plate 72b have a rectangular shape that is substantially the same as the shape of the second bent plate portion 22b and the third bent plate portion 23b, and the linking plate portion 72c is substantially perpendicular to one side of the second terminal connection plate 72a and one side of the third terminal connection plate 72b. The second terminal connection plate 72a is fixed to the leading end portion of the second bent plate portion 22b by inserting the second external connection portion 62, from the rear side, into holes (not shown) formed in the second bent plate portion 22b and the second terminal connection plate 72a. Similarly, the third terminal connection plate 72b is fixed to the leading end portion of the third bent plate portion 23b by inserting the third external connection portion 63, from the rear side, into holes (not shown) formed in the third bent plate portion 23b and the third terminal connection plate 72b.

The cross-sectional area of the linking member 72 configured in this manner is larger than that of the second conductive plate 22 and the third conductive plate 23.

Next, the arrangement configuration of the circuit board 40 will be described.

Figure 4:
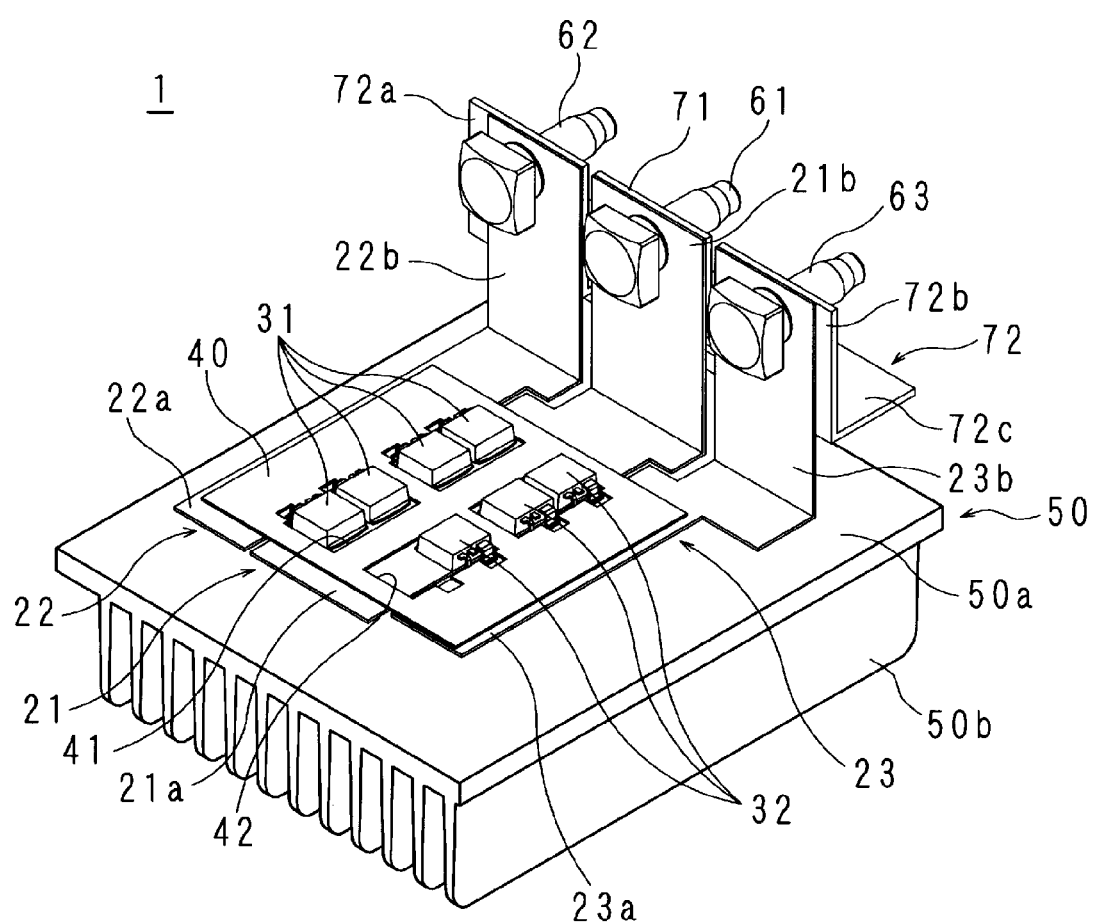
FIG. 4 is a rear perspective view showing one configuration example of the circuit device according to this embodiment.
Figure 5:
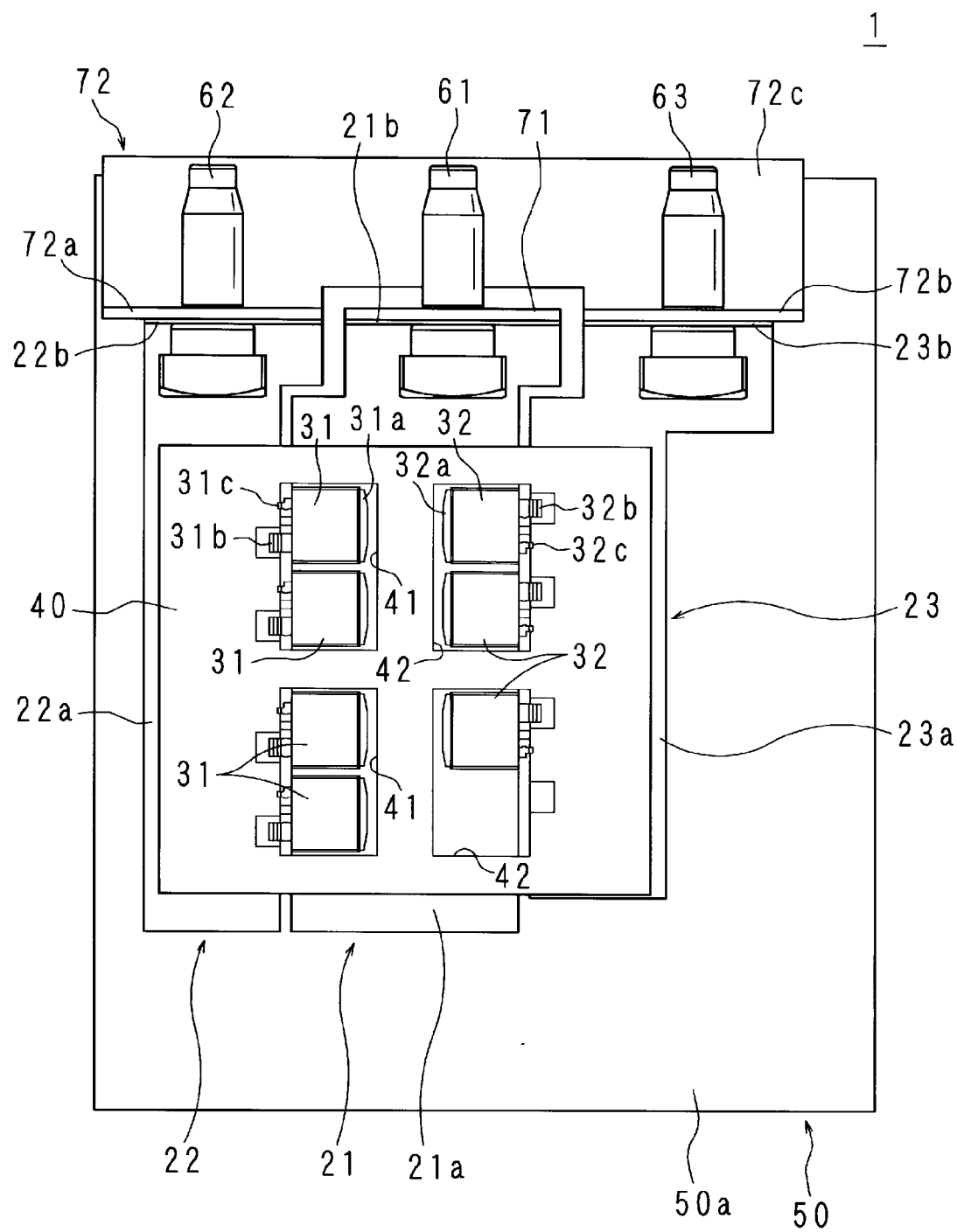
FIG. 5 is a plan view showing one configuration example of the circuit device according to this embodiment.
Figure 6:
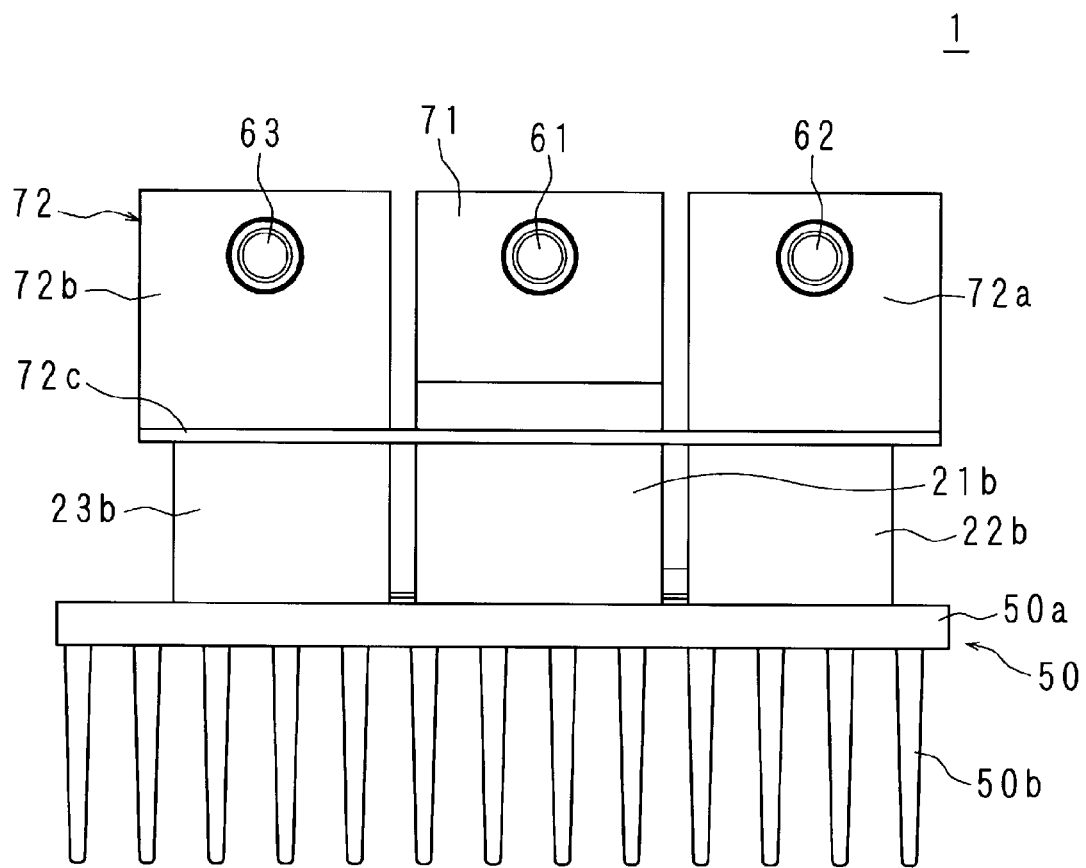
FIG. 6 is a front view showing one configuration example of the circuit device according to this embodiment.
Figure 7:
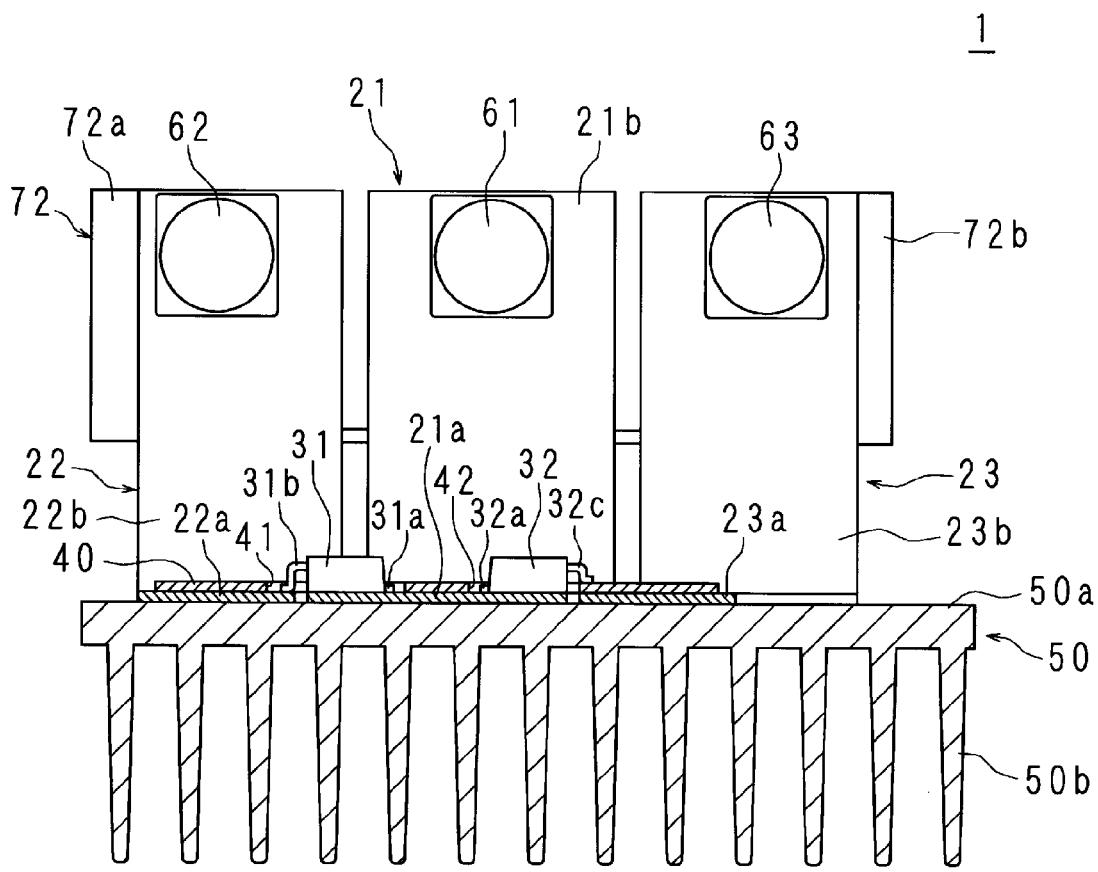
FIG. 7 is a rear view showing one configuration example of the circuit device according to this embodiment.

FIG. 4 is a rear perspective view showing one configuration example of the circuit device 1 according to this embodiment, FIG. 5 is a plan view showing one configuration example of the circuit device 1 according to this embodiment, FIG. 6 is a front view showing configuration example of the circuit device 1 according to this embodiment, and FIG. 7 is a rear view showing one configuration example of the circuit device 1 according to this embodiment. Note that, for convenience of creating drawings, the thickness of the first to third conductive plates 21, 22, and 23 and the circuit board 40 is emphasized in FIG. 7.

As shown in FIGS. 4 and 5, the circuit device 1 includes the circuit board 40 that is disposed on the upper sides of the first to third conductive plates 21, 22, and 23 and to which the third terminals 31c and 32c of the first and second circuit components 31 and 32 are connected.

The circuit board 40 has through-holes 41 having a shape such that only the third terminals 31c can catch on an upper portion of the circuit board 40 in a plan view, and the portions of the first circuit components 31 other than the third terminals 31c can vertically pass through the through holes 41. More specifically, each through-hole 41 has a shape such that two first circuit components 31 arranged side-by-side are substantially fitted, with play, into the through-hole 41. Two such through-holes 41 are formed in the circuit board 40.

Similarly, the circuit board 40 has through-holes 42 having a shape such that only the third terminals 32c can catch on an upper portion of the circuit board 40 in a plan view, and portions of the second circuit components 32 other than the third terminals 32c can vertically pass through the through holes 42. The specific shape of the through-hole 42 is the same as that of the through-hole 41.

A control circuit (not shown) for controlling operations of the first and second circuit components 31 and 32 is disposed on the circuit board 40, and the third terminals 31c and 32c of the first and second circuit components 31 and 32 are connected to the control circuit via a conductive wiring pattern. The control circuit applies a voltage corresponding to a control signal to the third terminals 31c and 32c of the first and second circuit components 31 and 32 via the wiring pattern, and turns ON/OFF an electric current flowing through the first and second circuit components 31 and 32.

Figure 8:
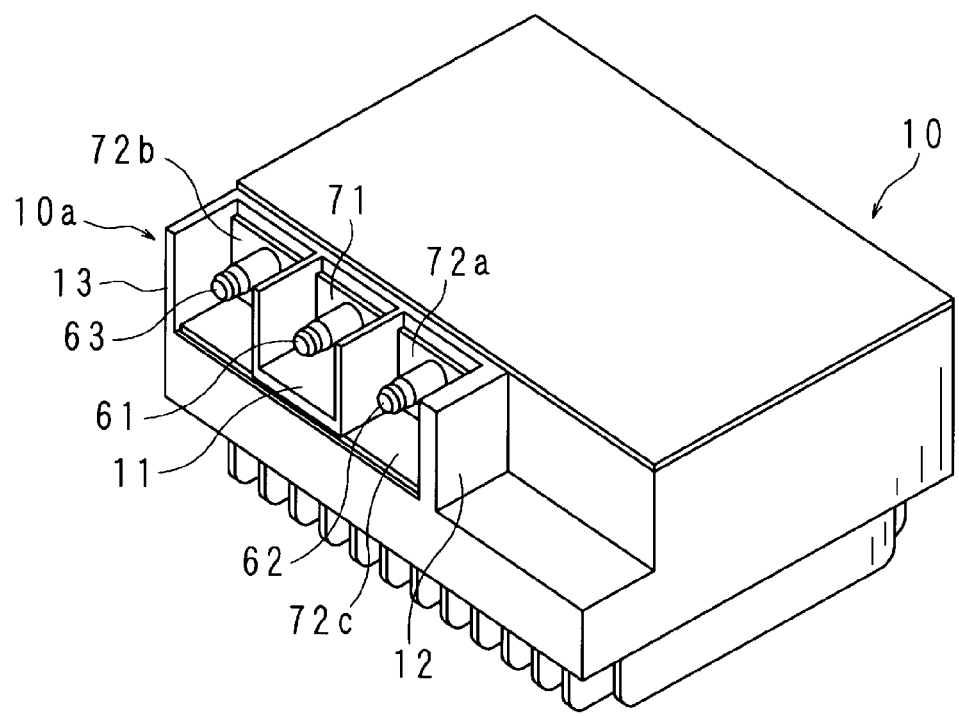
FIG. 8 is a front perspective view showing one configuration example of the circuit device housed in a housing.

FIG. 8 is a front perspective view showing one configuration example of the circuit device 1 housed in the housing 10. The circuit device 1 configured as described above, that is, the first to third conductive plates 21, 22, and 23, the first and second circuit components 31 and 32, and the circuit board 40 are housed in the housing 10, which has a substantially rectangular parallelepiped shape. However, a lower portion of the radiator 50 and the heat dissipation fins 50b are exposed on the lower side of the housing 10. A terminal block 10a having a step shape in a side view is formed on the front side of the housing 10, and the first to third external connection portions 61, 62, and 63 protrude from a front portion of the terminal block 10a. The first terminal connection plate 71 and the linking member 72 are disposed outside the housing 10, specifically, on the terminal block 10a.

Also, the terminal block 10a has a first partition 11 that is substantially U-shaped in a front view, surrounds both sides and a lower portion of the first terminal connection plate 71, and separates the second and third terminal connection plates 72a and 72b. Also, the terminal block 10a has a second partition 12 covering the laterally outer side of the second terminal connection plate 72a, and a third partition 13 covering the laterally outer side of the third terminal connection plate 72b.

Next, effects of the circuit device 1 according to this embodiment will be described.

Figure 9:
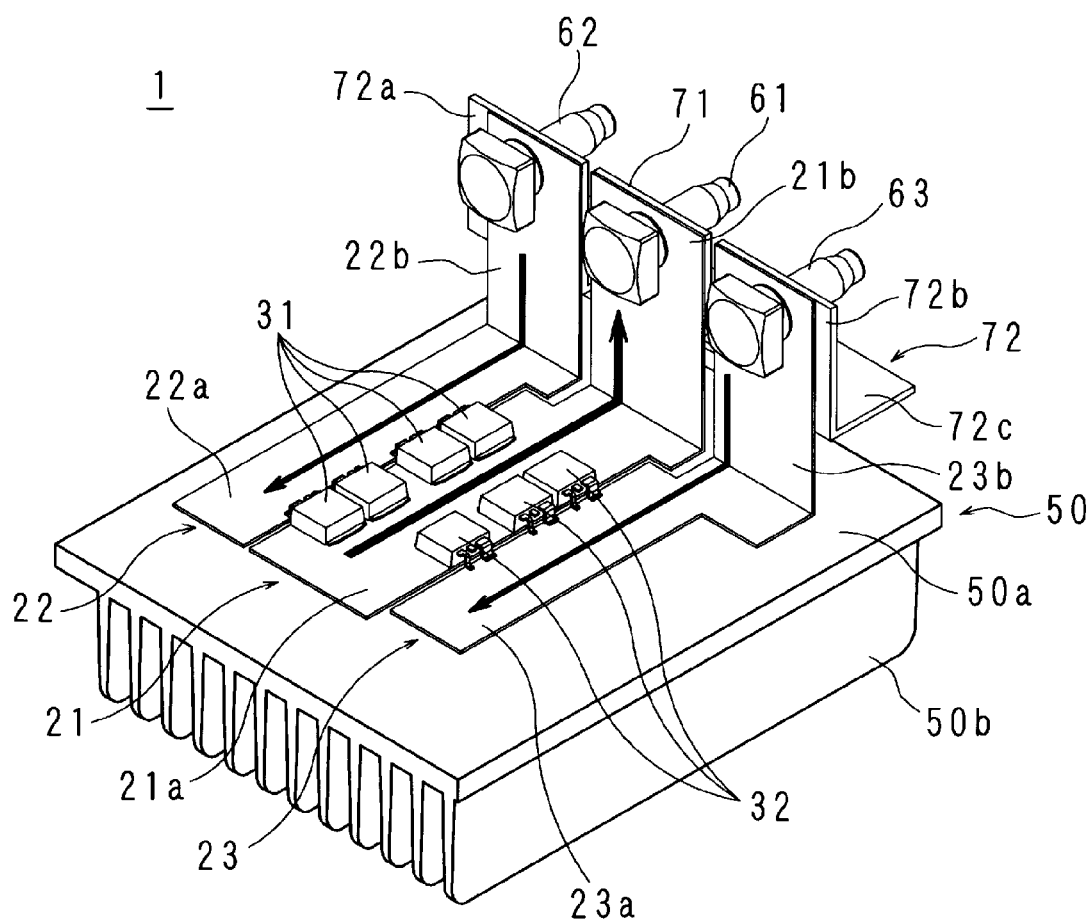
FIG. 9 is a rear perspective view showing the flow of an electric current in the circuit device according to this embodiment.
Figure 10:
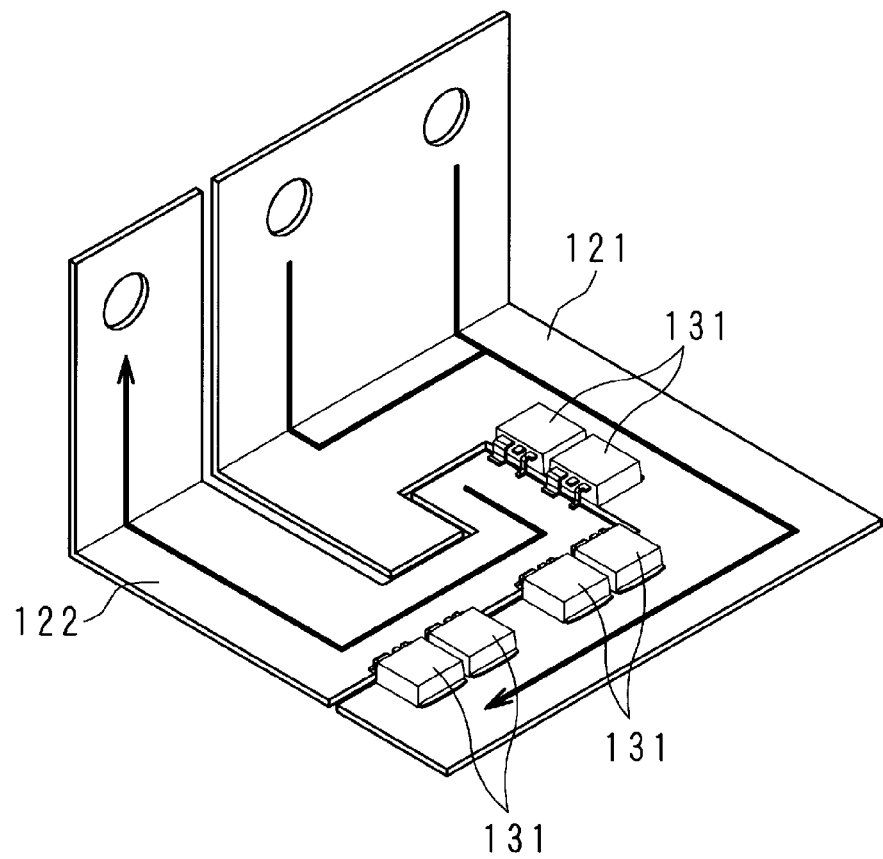
FIG. 10 is a rear perspective view showing the flow of an electric current in a circuit device according to a comparative example.

FIG. 9 is a rear perspective view showing the flow of an electric current in the circuit device 1 according to this embodiment, and FIG. 10 is a rear perspective view showing the flow of an electric current in a circuit device 1 according to a comparative example. As shown in FIG. 10, the circuit device according to the comparative example includes a pair of a first conductive plate 121 and a second conductive plate 122 that have hook shapes, and the first and second conductive plates 121 and 122 are fitted to each other with a predetermined gap provided therebetween such that their overall shape is a rectangular flat plate. A plurality of circuit components 131, which are MOSFETs, are arranged side-by-side along a side portion of the first conductive plate 121 such that power supply paths of the circuit components 131 are substantially uniform. The drain terminals of the circuit components 131 are connected to the first conductive plate 121, and the source terminals of the circuit components 131 are connected to the second conductive plate 122. Solid arrows indicate an electric current, and the magnitude of an electric current is indicated by the width of the solid arrow in FIGS. 9 and 10.

As can be understood from a comparison between FIGS. 9 and 10, the circuit device 1 according to this embodiment makes it possible to make the area for mounting the first and second circuit components 31 and 32 and the first to third conductive plates 21, 22, and 23 smaller than that in a configuration in which the pair of first and second conductive plates 121 and 122 connected to both terminals of each of the plurality of circuit components 131 are routed.

Also, a characteristic layer structure of the radiator 50, the first to third conductive plates 21, 22, and 23, and the circuit board 40 makes it possible to effectively dissipate heat generated by an electric current flowing through the first to third conductive plates 21, 22, and 23 from the radiator 50 located on its lower side.

Also, according to this embodiment, it is possible to reduce the size of the circuit device 1 including semiconductor switches as the first and second circuit components 31 and 32, specifically, field effect transistors such as MOSFETs.

Furthermore, larger first terminals 31*a* and 32*a* are connected to a wider first conductive plate 21, and the first and second circuit components 31 and 32 are disposed on the first conductive plate 21. Thus, the circuit device 1 can be made smaller.

Also, because the linking member 72 is disposed outside the housing 10, it is possible to dissipate heat generated in the first to third conductive plates 21, 22, and 23 and the first and second circuit components 31 and 32 to the outside of the housing 10 via the linking member 72. It is also possible to effectively dissipate heat generated in the linking member 72.

Furthermore, one end of the second conductive plate 22 and one end of the third conductive plate 23 are linked by the linking member 72 whose cross-sectional area is larger than that of the second and third conductive plates 22 and 23. Generation of heat in the linking member 72 can be suppressed by increasing the cross-sectional area of the linking member 72. Although the second and third conductive plates 22 and 23 have a smaller cross-sectional area than that of the linking member 72, an electric current flowing on the one end is shunted to the second and third conductive plates 22 and 23, and thus, it is also possible to suppress generation of heat in the second and third conductive plates 22 and 23.

Although the first and second circuit components 31 and 32 have been described mainly as switching elements in this embodiment, the present disclosure can be applied to a circuit device 1 having a plurality of circuit components that each have the first terminals 31*a* and 32*a* and the second terminals 31*b* and 32*b* and generate heat through supply of power. Also, needless to say, there is no limitation on the number of first circuit components 31 and the number of second circuit components 32.

Although a MOSFET has been described as one example of a switching element, the MOSFET is an example and there is no particular limitation thereon. It is also possible to utilize, as circuit components, power devices such as another field effect transistor (e.g., a junction FET), an IGBT (Insulated Gate Bipolar Transistor), and a bipolar transistor, for example.

Furthermore, although an example has been described in which the first terminals 31*a* and 32*a*, which are drain terminals of the first and second circuit components 31 and 32 are connected to the first conductive plate 21, and the second terminals 31*b* and 32*b*, which are source terminals, are connected to the second and third conductive plates 22 and 23, a configuration may be adopted in which the source terminal is connected to the first conductive plate 21, and the drain terminals are connected to the second and third conductive plates 22 and 23.

The invention claimed is:

1. A circuit device comprising:
a first conductive plate having a belt-shaped portion;
a second conductive plate having a belt-shaped portion that is arranged side-by-side with one side portion of the first conductive plate and is spaced apart from the one side portion;
a third conductive plate having a belt-shaped portion that is arranged side-by-side with another side portion of the first conductive plate and is spaced apart from the other side portion;
a first circuit component that has a first terminal connected to the first conductive plate and a second terminal connected to the second conductive plate;
a second circuit component that has a first terminal connected to the first conductive plate and a second terminal connected to the third conductive plate;
a first external connection portion provided at the belt-shaped portion of the first conductive plate; and
a second external connection portion provided at the belt-shaped portion of the second conductive plate, or a third external connection portion provided at the belt-shaped portion of the third conductive plate,
wherein the first circuit component and the second circuit component each include a third terminal for controlling an electric current,
the circuit device comprises:
a circuit board that is disposed on one side of the first conductive plate, the second conductive plate, and the third conductive plate, and to which the third terminals of the first circuit component and the second circuit component are connected; and
a radiator that is disposed on the other side of the first conductive plate, the second conductive plate, and the third conductive plate, and
the circuit board has through-holes through which the first circuit component and the second circuit component respectively pass, a control circuit for controlling operations of the first circuit component and the second circuit component is disposed on the circuit board, and the control circuit is connected to the third terminals of the first circuit component and the second circuit component via a conductive wiring pattern.

2. The circuit device according to claim 1, wherein the first circuit component and the second circuit component are semiconductor switches.

3. The circuit device according to claim 1, wherein the first circuit component and the second circuit component are field effect transistors, and
the first terminals are drain terminals, the second terminals are source terminals, and the third terminals are gate terminals.

4. The circuit device according to claim 1,
wherein the first terminal is larger than the second terminal,
the width of the belt-shaped portion of the first conductive plate is larger than the width of the belt-shaped portions of the second conductive plate and the third conductive plate, and
the first circuit component and the second circuit component are disposed on the first conductive plate.

5. The circuit device according to claim 1, comprising a linking member for electrically linking the belt-shaped portion of the second conductive plate or the belt-shaped portion of the third conductive plate, wherein the cross-sectional area of the linking member is larger than that of the second conductive plate and the third conductive plate.

6. The circuit device according to claim 5, comprising a housing for housing the first conductive plate, the second conductive plate, the third conductive plate, the first circuit component, and the second circuit component,
wherein the linking member is disposed outside the housing.

7. The circuit device according to claim 2, wherein the first circuit component and the second circuit component are field effect transistors, and
the first terminals are drain terminals, the second terminals are source terminals, and the third terminals are gate terminals.

8. The circuit device according to claim 2,
wherein the first terminal is larger than the second terminal,
the width of the belt-shaped portion of the first conductive plate is larger than the width of the belt-shaped portions of the second conductive plate and the third conductive plate, and
the first circuit component and the second circuit component are disposed on the first conductive plate.

9. The circuit device according to claim 3,
wherein the first terminal is larger than the second terminal,
the width of the belt-shaped portion of the first conductive plate is larger than the width of the belt-shaped portions of the second conductive plate and the third conductive plate, and
the first circuit component and the second circuit component are disposed on the first conductive plate.

10. The circuit device according to claim 2, comprising a linking member for electrically linking the belt-shaped portion of the second conductive plate or the belt-shaped portion of the third conductive plate,
wherein the cross-sectional area of the linking member is larger than that of the second conductive plate and the third conductive plate.

11. The circuit device according to claim 3, comprising a linking member for electrically linking the belt-shaped portion of the second conductive plate or the belt-shaped portion of the third conductive plate,
wherein the cross-sectional area of the linking member is larger than that of the second conductive plate and the third conductive plate.

12. The circuit device according to claim 4, comprising a linking member for electrically linking the belt-shaped portion of the second conductive plate or the belt-shaped portion of the third conductive plate,
wherein the cross-sectional area of the linking member is larger than that of the second conductive plate and the third conductive plate.

* * * * *